(12) United States Patent
Li (10) Patent No.: US 11,569,462 B2
(45) Date of Patent: Jan. 31, 2023

(54) FLEXIBLE ARRAY SUBSTRATE, PREPARATION METHOD THEREOF, AND FLEXIBLE DISPLAY PANEL

(71) Applicant: BOE Technology Group Co., Ltd., Beijing (CN)

(72) Inventor: Xiaolong Li, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 290 days.

(21) Appl. No.: 16/605,181

(22) PCT Filed: Mar. 20, 2019

(86) PCT No.: PCT/CN2019/078868
§ 371 (c)(1),
(2) Date: Oct. 14, 2019

(87) PCT Pub. No.: WO2019/196612
PCT Pub. Date: Oct. 17, 2019

(65) Prior Publication Data
US 2020/0243778 A1  Jul. 30, 2020

(30) Foreign Application Priority Data
Apr. 9, 2018 (CN) .......................... 201810310471.0

(51) Int. Cl.
*H01L 23/48* (2006.01)
*H01L 51/00* (2006.01)
(Continued)

(52) U.S. Cl.
CPC ...... *H01L 51/0097* (2013.01); *H01L 27/3258* (2013.01); *H01L 27/3276* (2013.01);
(Continued)

(58) Field of Classification Search
CPC ............. H01L 51/0097; H01L 27/3258; H01L 27/3276; H01L 27/1218; H01L 27/1244;
(Continued)

(56) References Cited

U.S. PATENT DOCUMENTS

| | | | |
|---|---|---|---|
| 9,082,667 B2 | 7/2015 | Youn et al. | |
| 9,293,485 B2 | 3/2016 | Youn et al. | |
| 2010/0141630 A1* | 6/2010 | Kimura | G09G 3/3233 345/211 |
| 2014/0353670 A1 | 12/2014 | Youn et al. | |
| 2015/0287750 A1 | 10/2015 | Youn et al. | |

(Continued)

FOREIGN PATENT DOCUMENTS

| | | |
|---|---|---|
| CN | 104183600 A | 12/2014 |
| CN | 104752365 A | 7/2015 |

(Continued)

*Primary Examiner* — Samuel Park
(74) *Attorney, Agent, or Firm* — Westman, Champlin & Koehler, P.A.

(57) ABSTRACT

Disclosed are a flexible array substrate, a preparation method thereof, and a flexible display panel. The flexible array substrate comprises a plurality of pixel island regions sequentially arranged, with a flexible region being disposed between adjacent pixel island regions, wherein each of the pixel island regions comprises a gate electrode, and the flexible region comprises a first connecting wire, an elastic layer disposed on the first connecting wire, and a second connecting wire disposed on the elastic layer, wherein a plurality of interlayer via holes are disposed in the elastic layer, an elastic conductive pillar is disposed in each of the interlayer via holes, the elastic conductive pillar is conductively connected to the first connecting wire and the second connecting wire respectively, and the first connecting wire and/or the second connecting wire are/is connected to the gate electrodes of adjacent pixel island regions.

15 Claims, 6 Drawing Sheets

(51) Int. Cl.
*H01L 27/32* (2006.01)
*H01L 27/12* (2006.01)

(52) U.S. Cl.
CPC ...... *H01L 27/1218* (2013.01); *H01L 27/1244* (2013.01); *H01L 27/1248* (2013.01); *H01L 27/1288* (2013.01); *H01L 2227/323* (2013.01); *H01L 2251/5338* (2013.01)

(58) Field of Classification Search
CPC ............ H01L 27/1248; H01L 27/1288; H01L 2227/323; H01L 2251/5338; H01L 27/1259; H01L 27/1214; H01L 27/124; H01L 27/32; H01L 51/52; Y02E 10/549; Y02P 70/50; G09F 9/00
See application file for complete search history.

(56) References Cited

U.S. PATENT DOCUMENTS

| | | | |
|---|---|---|---|
| 2016/0064464 A1 | 3/2016 | Namkung et al. | |
| 2016/0103534 A1* | 4/2016 | Zhang .................. | G06F 3/0412 345/173 |
| 2016/0218305 A1* | 7/2016 | Kim .................. | G02F 1/133345 |
| 2018/0046221 A1* | 2/2018 | Choi .................. | G02B 26/0825 |
| 2019/0280077 A1* | 9/2019 | Park .................... | H01L 27/3258 |
| 2019/0355762 A1 | 11/2019 | Wang et al. | |

FOREIGN PATENT DOCUMENTS

| | | |
|---|---|---|
| CN | 207134068 U | 3/2018 |
| CN | 108461531 A | 8/2018 |

\* cited by examiner

FLEXIBLE ARRAY SUBSTRATE, PREPARATION METHOD THEREOF, AND FLEXIBLE DISPLAY PANEL

CROSS REFERENCE TO RELATED APPLICATION

The present application is a Section 371 National Stage application of International Application No. PCT/CN2019/078868, filed on 20 Mar. 2019, which has not yet published, and claims priority to Chinese Patent Application No. 201810310471.0, filed on Apr. 9, 2018, with a title of "flexible array substrate, preparation method thereof, and flexible display panel", the contents of which are incorporated herein by reference.

TECHNICAL FIELD

The present application generally relates to the technical field of display, and particularly to a flexible array substrate, a preparation method thereof, and a flexible display panel.

BACKGROUND

In the technical field of display, liquid crystal display (LCD) devices and organic light emitting diode (OLED) display devices have gradually replaced cathode ray tube (CRT) displays. An OLED display device has advantages of self-luminescence, low driving voltage, high luminescence efficiency, short response time, high definition and contrast, a view angle of nearly 180°, wide range of operating temperature and so on, and can enable a large-area full color display, so it has a prospect of becoming a next generation panel display technology after the LCD technology. Thus, the OLED display technology is one of the panel display technologies attracting more attentions. Active matrix organic light emitting diode (AMOLED) display device is one kind of OLED display devices, and is essentially consisted of a thin film transistor (TFT) and an OLED. With continuous development of display technologies, the AMOLED technology is more and more used in flexible display.

SUMMARY

The present disclosure provides a flexible array substrate, a preparation method thereof, and a flexible display panel.

One aspect of the present disclosure provides a flexible array substrate comprising a plurality of pixel island regions sequentially arranged, with a flexible region being disposed between adjacent pixel island regions, wherein each of the pixel island regions comprises a gate electrode, and the flexible region comprises a first connecting wire, an elastic layer disposed on the first connecting wire, and a second connecting wire disposed on the elastic layer, wherein a plurality of interlayer via holes are disposed in the elastic layer, an elastic conductive pillar is disposed in each of the interlayer via holes and is conductively connected to the first connecting wire and the second connecting wire respectively, and the first connecting wire and/or the second connecting wire are/is connected to the gate electrodes of adjacent pixel island regions.

Optionally, the flexible region further comprises an additional elastic layer disposed below the first connecting wire.

Optionally, a material for forming the elastic layer and/or the additional elastic layer comprises polyimide or a planarization material.

Optionally, a material for forming the first connecting wire or the second connecting wire comprises a conductive polymer or a metal; a material for forming the elastic conductive pillar comprises a conductive polymer, nano-silver, carbon nanotube or graphene.

Optionally, on a projection plane parallel to the flexible array substrate, at least one of the first connecting wire and the second connecting wire have an S-shape, a U shape or a sine curve shape.

Optionally, the flexible array substrate further comprises a flexible substrate, wherein the pixel island regions and the flexible region are disposed on the flexible substrate.

Optionally, a material for forming the flexible substrate comprises polyimide.

Another aspect of the present disclosure provides a preparation method for a flexible array substrate, comprising:

forming a gate electrode in each of a plurality of pixel island regions sequentially arranged; and forming a first connecting wire in a flexible region between adjacent pixel island regions, forming an elastic layer on the first connecting wire, forming a plurality of interlayer via holes in the elastic layer, forming an elastic conductive pillar in each of the interlayer via holes, and forming a second connecting wire on the elastic layer, wherein the elastic conductive pillar is conductively connected to the first connecting wire and the second connecting wire respectively, and the first connecting wire and/or the second connecting wire are/is connected to the gate electrodes of adjacent pixel island regions.

Optionally, before forming the first connecting wire, the preparation method further comprises a step of forming an additional elastic layer in the flexible region between adjacent pixel island regions.

Optionally, the step of forming a gate electrode in each of a plurality of pixel island regions sequentially arranged comprises:

forming an active layer, a gate insulating layer and a gate electrode sequentially on a flexible substrate; and forming an interlayer insulating layer by a patterning process, wherein the interlayer insulating layer in each of the pixel island regions is provided with a first via hole, and the flexible region between adjacent pixel island regions is provided with a flexible channel such that the flexible substrate is exposed through the flexible channel.

Optionally, the step of forming an additional elastic layer in the flexible region between adjacent pixel island regions comprises:

applying a first polyimide photoresist, the first polyimide photoresist covering the interlayer insulating layer and the flexible substrate exposed through the flexible channel; exposing and developing the first polyimide photoresist to form a fully exposed region in the flexible region; and removing the first polyimide photoresist in the pixel island regions, thereby forming an additional elastic layer on the flexible substrate.

Optionally, the steps of forming a first connecting wire in a flexible region between adjacent pixel island regions, forming an elastic layer on the first connecting wire, forming a plurality of interlayer via holes in the elastic layer, forming an elastic conductive pillar in each of the interlayer via holes, and forming a second connecting wire on the elastic layer comprise:

forming a first conductive layer on the additional elastic layer and patterning the first conductive layer to form the first connecting wire;

applying a second polyimide photoresist on the first connecting wire, the second polyimide photoresist covering the interlayer insulating layer and the additional elastic layer; exposing and developing the second polyimide photoresist to form fully exposed regions in areas of the flexible region other than regions of the interlayer via holes; and removing the second polyimide photoresist in the pixel island regions and in the regions of the interlayer via holes to form the elastic layer;

forming the elastic conductive pillar in each of the interlayer via holes; and forming a second conductive layer on the elastic layer and patterning the second conductive layer to form the second connecting wire, wherein the first connecting wire and/or the second connecting wire are/is connected to the gate electrodes of adjacent pixel island regions through the first via holes.

Optionally, a material for forming the elastic conductive pillar comprises a conductive polymer, nano-silver, carbon nanotube or graphene.

Optionally, on a projection plane parallel to the flexible array substrate, the first connecting wire and the second connecting wire have an S-shape, a U shape or a sine curve shape.

Optionally, a material for forming the first connecting wire or the second connecting wire comprises a conductive polymer or a metal.

The present disclosure also provides a flexible display panel comprising the flexible array substrate as described above.

BRIEF DESCRIPTION OF DRAWINGS

Other features, objects and advantages of the present disclosure will become more apparent from reading the detail description of non-limiting embodiments with reference to the following figures.

DETAILED DESCRIPTION

In a flexible AMOLED display panel, a flexible array substrate is a main component and generally comprises a plurality of gate lines and a plurality of data lines crosswise arranged on a flexible substrate, and the gate lines and the data lines enclose pixels arranged in an array. Because each pixel comprises both a TFT structure and an OLED structure, as well as respective driving circuits, the flexible AMOLED display panel has characteristics of high pixel density and dense wiring. Thus, it is very difficult for the flexible AMOLED display panel to be stretchable and bendable. One of the difficulties is that when the flexible AMOLED display panel is stretched or bent, the insulating layer and the gate lines are liable to breakage, resulting in undesirable line breakage in the display panel.

The present disclosure provides a flexible array substrate, a preparation method thereof and a flexible display panel, wherein the flexible array substrate is divided into a plurality of pixel island regions and a plurality of flexible regions, wherein the plurality of pixel island regions are configured as pixel units in effective display areas, and each of the plurality of flexible regions is disposed between two pixel island regions as a stretchable or bendable region, in each of the plurality of flexible regions an inorganic material layer is removed, first and second connecting wires and an elastic layer therebetween are disposed, and the first and second connecting wires are electrically connected to each other through elastic conductive pillars disposed in via holes in the elastic layer, such that the stretching stress can be effectively resisted, ensuring that no breakage of the connecting wires occurs. In addition, the first connecting wire and/or the second connecting wire are/is connected to the gate electrodes of adjacent pixel island regions. Such double-layer connecting wires are dual fail-safe, and thus a normal display will not be affected even if one of the connecting wires is broken upon bending. Because of the configuration of the elastic conductive pillars cooperated with the double-layer connecting wire electrical structure, there is also an excellent stretching property in a direction perpendicular to the flexible array substrate. As a result, it is ensured that the flexible region has sufficient stretching and bending properties in both the horizontal and vertical directions, thereby achieving good stretchability and bendability of the flexible array substrate.

The present disclosure is further described in detail below with reference to the drawings and embodiments. It can be understood that particular embodiments described here are only intended to explain related invention, but not to limit the invention. It should also be noted that the drawings only show parts related to the invention for the convenience of description.

It should be noted that, unless contradiction, the embodiments of the present disclosure and the features in the embodiments can be combined with each other. The present disclosure will be described in detail below with reference to the drawings in conjunction with the embodiments.

Figure 1:
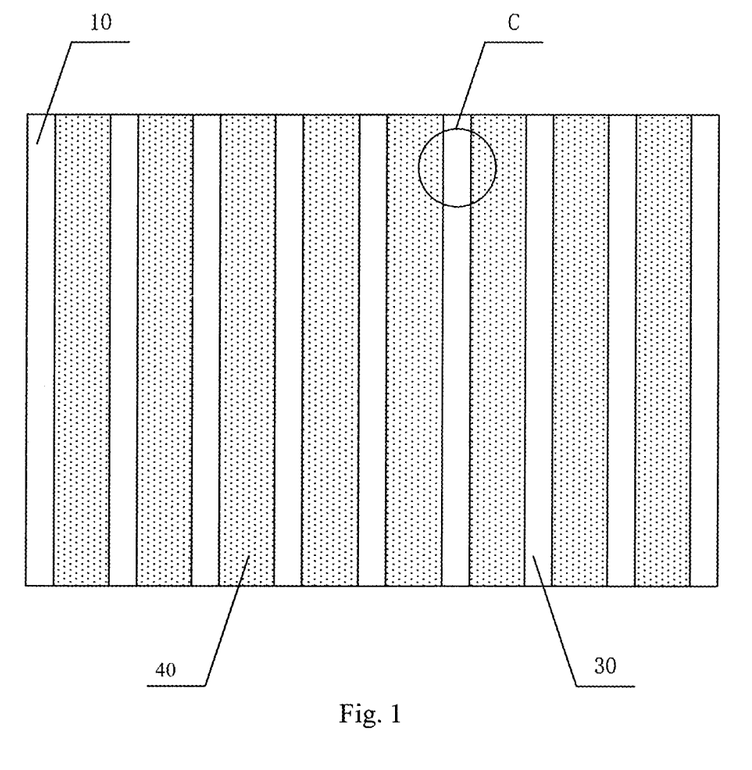
FIG. 1 is a structural schematic diagram of a flexible array substrate according an embodiment of the present disclosure.
Figure 2:
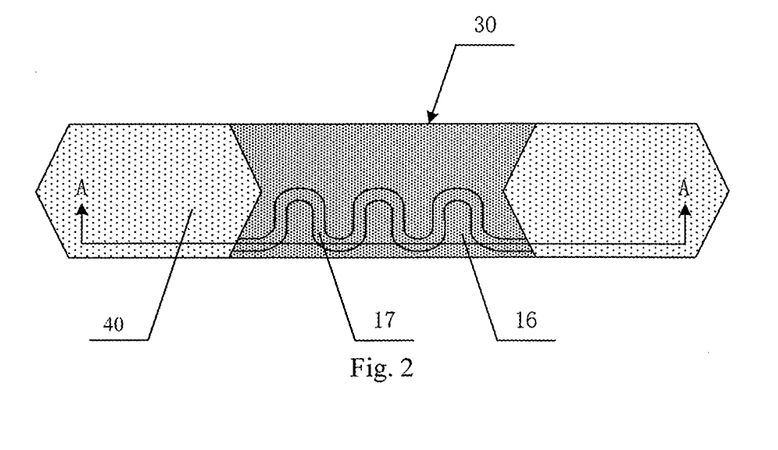
FIG. 2 is an enlarged view of region C in FIG. 1.
Figure 11:
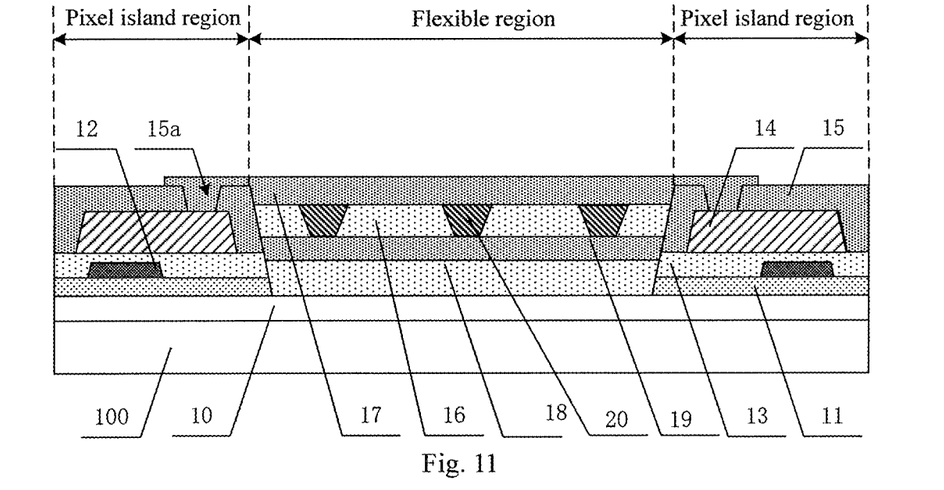
FIG. 11 is a schematic diagram of one embodiment of the present disclosure after forming a second connecting wire.

As shown in FIG. 1, FIG. 2 and FIG. 11, the flexible array substrate provided in the embodiments of the present disclosure comprises a plurality of pixel island regions 40 sequentially arranged, with a flexible region 30 being disposed between adjacent pixel island regions 40, wherein each of the pixel island regions 40 comprises a gate electrode 14, and the flexible region 30 comprises a first elastic layer 18, a first connecting wire 19 disposed on the first elastic layer 18, a second elastic layer 16 disposed on the first connecting wire 19, and a second connecting wire 17 disposed on the second elastic layer 16, wherein a plurality of interlayer via holes 21 are disposed in the second elastic layer 16, an elastic conductive pillar 20 is disposed in each of the interlayer via holes 21, wherein the elastic conductive pillar 20 is conductively connected to the first connecting wire 19 and the second connecting wire 17 respectively, and the first connecting wire 19 and/or the second connecting wire 17 are/is connected to the gate electrodes 14 of adjacent pixel island regions 40.

As one implementation, the major structure of the flexible array substrate comprises a flexible substrate 10, a plurality of pixel island regions 40 sequentially arranged on the flexible substrate 10, with a flexible region 30 being disposed between adjacent pixel island regions 40. Here, each of the pixel island regions 40 comprises at least two pixel columns as effective display areas, wherein each of the pixel column comprises a plurality of pixel units defined by gate lines and data lines, and each of the pixel units comprises a thin film transistor structure and an organic light emitting layer structure. The flexible region 30 comprises a first elastic layer 18 disposed on the flexible substrate 10, a first connecting wire 19 disposed on the first elastic layer 18, a second elastic layer 16 disposed on the first connecting wire 19, and a second connecting wire 17 disposed on the second elastic layer 16, wherein a plurality of interlayer via holes 21 are disposed in the second elastic layer 16, an elastic conductive pillar 20 is disposed in each of the interlayer via holes 21, the elastic conductive pillar 20 is conductively connected to the first connecting wire 19 and the second connecting wire 17 respectively, and the second connecting wire 17 is used for connecting the gate electrodes 14 of adjacent pixel island regions 40.

It should be noted that because in the flexible region, an inorganic material layer is firstly removed to form a flexible channel, and then the elastic layers and the connecting wires are disposed, two elastic layers are disposed in the flexible region in the above technical solution, wherein the first elastic layer at the bottom layer has a heightening function to eliminate or reduce difference between heights of the connecting wires and the gate electrodes to be connected. However, the first elastic layer at the bottom layer is not necessary, and the same object can be achieved by disposing a relatively thick second elastic layer between the first and second connecting wires.

The technical solutions of the present disclosure will be described in detail below through the preparation process of a flexible array substrate.

The "patterning process" used herein includes treatments such as depositing a film layer, applying a photoresist, exposing through a mask, developing, etching, stripping photoresist off and so on, and is a mature preparation process. The depositing may be carried out by known processes such as sputtering, evaporation, chemical vapor deposition and the like, the applying may be carried out by known coating processes, and the etching may be carried out by known methods, which are not particularly limited here.

A general process for preparing a flexible array substrate of the present disclosure is as follows: a flexible substrate 10 is firstly formed on a base substrate 100, then structural layers such as a thin film transistor and an organic light emitting layer are formed on the flexible substrate 10, and after the preparation of the flexible array substrate is completed, the flexible substrate 10 is peeled off from the base substrate 100. Here, a material such as glass or silicon may be used for the base substrate 100, and a polyimide (PI) material may be used for the flexible substrate 10, with a thickness of 5 µm to 15 µm.

Specifically, forming the structural layers such as a thin film transistor and an organic light emitting layer on the flexible substrate 10 may comprise the following steps.

Figure 3:
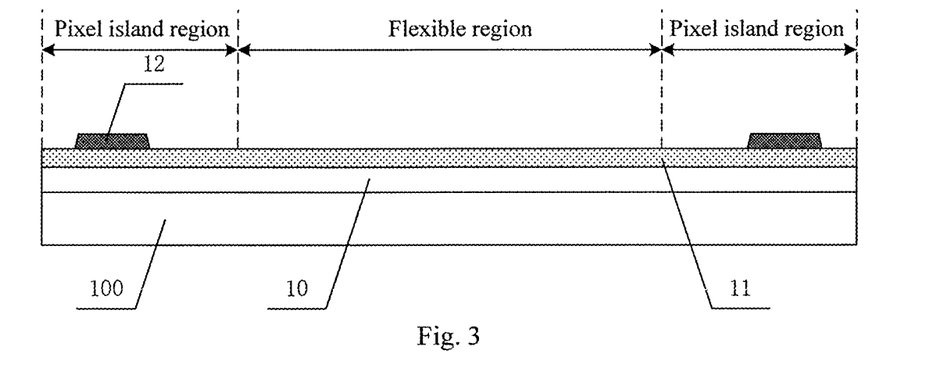
FIG. 3 is a schematic diagram of one embodiment of the present disclosure after forming a buffer layer and an active layer pattern.

1. Forming a buffer layer and an active layer pattern on a flexible substrate 10. Forming a buffer layer and an active layer pattern comprises: after forming the flexible substrate 10 on the base substrate 100, depositing a buffer layer 11 and an amorphous silicon film sequentially on the flexible substrate 10, treating the amorphous silicon film by a laser process to convert the amorphous silicon film to a poly-silicon film, applying a layer of photoresist on the poly-silicon film, exposing and developing the photoresist with a monotone masking plate, etching the poly-silicon film and stripping off the remaining photoresist, to form a pattern of active layer 12 in the pixel island regions, as shown in FIG. 3. After this process, the flexible region comprises the buffer layer 11 formed on the flexible substrate 10.

Here, the buffer layer 11 is used for preventing impurity metal ions of the base substrate 100 from diffusing into the active layer during a heating process, so as to avoid any effects on properties such as threshold voltage and leakage current. Suitable buffer layer can improve the quality of the back interface of the poly-silicon layer to avoid any leakage current at the back interface of the poly-silicon layer, and can further reduce heat conduction to reduce the cooling rate of the laser-heated silicon. A material of silicon oxide ($SiO_x$), silicon nitride ($SiN_x$) or silicon oxynitride ($Si(ON)_x$) may be used for the buffer layer 11. The buffer layer may be a mono-layer, double-layer or multi-layer structure, such as a $SiN_x/SiO_x$ composite film, with a thickness of 100 nm to 500 nm. In this way, the buffer layer can have better blocking and planarization functions while facilitating stress release among the films.

Here, XeCl laser, ArF laser, KrF laser, XeF laser or the like may be used as the laser. Such excimer lasers produce laser beams within an ultraviolet wavelength band. By irradiating the amorphous silicon film with a short-pulse laser beam within the ultraviolet wavelength band, the amorphous film will rapidly absorb laser energy to melt and recrystallize. The active layer 12 may be an active layer of low temperature poly-silicon (LTPS) for forming a LTPS thin film transistor. The LTPS thin film transistor has various advantages. For an example, the electron mobility thereof can reach 200 $cm^2$/V-sec or more, which can not only effectively reduce the area of the thin film transistor, increase the aperture ratio, but also reduce the overall power consumption while increasing the display luminance. For another example, a relatively high electron mobility can allow a portion of driving circuit to be integrated into the substrate, reduce IC of driving integrated circuit, significantly improve the reliability of the flexible display panel, and significantly reduce the manufacture cost. The active layer 12 has a thickness of 40 nm to 50 nm. In practical implementation, the active layer 12 may also be treated to form a doped region, which can form a good electrical connection between source/drain electrodes and the active layer.

In practical implementation, the buffer layer 11 may be configured to have a light-shielding function to form a light-shielding buffer layer, or a light-shielding layer may be disposed between the buffer layer and the amorphous silicon film. In addition, the buffer layer and the laser treatment may not be provided according to the type of the array substrate.

For example, when applied in an array substrate of amorphous silicon thin film transistor, the buffer layer may not be provided, and no laser treatment is performed. When applied in an array substrate of metal oxide thin film transistor, a material for the active layer may be an oxide semiconductor material, such as indium gallium zinc oxide (IGZO), indium tin zinc oxide (ITZO), indium zinc oxide (IZO), indium gallium oxide (IGO) or indium aluminum zinc oxide (IAZO).

Figure 4:
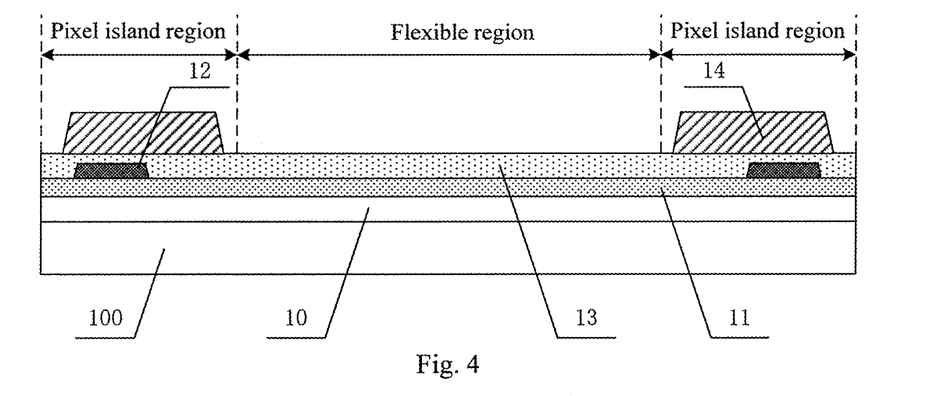
FIG. 4 is a schematic diagram of one embodiment of the present disclosure after forming a gate insulating layer and a gate electrode pattern.

2. Forming a gate insulating layer and a gate electrode pattern on the flexible substrate 10. Forming a gate insulating layer and a gate electrode pattern comprises: depositing a gate insulating layer 13 and a gate metal film sequentially on the flexible substrate 10 with the aforementioned pattern formed thereon, applying a layer of photoresist on the gate metal film, exposing and developing the photoresist with a monotone masking plate, etching the gate metal film and stripping off the remaining photoresist, to form a pattern of gate electrode 14 in the pixel island regions, as shown in FIG. 4. After this process, the flexible region comprises a buffer layer 11 and a gate insulating layer 13 formed on the flexible substrate 10.

Here, a material of $SiO_x$, $SiN_x$ or $Si(ON)_x$ may be used for the gate insulating layer 13. The gate insulating layer may be a mono-layer, double-layer or multi-layer structure, such as a $SiN_x/SiO_x$ composite film, with a thickness of 120 nm to 150 nm. One or more selected from metals of platinum (Pt), ruthenium (Ru), gold (Au), silver (Ag), molybdenum (Mo), chromium (Cr), aluminum (Al), tantalum (Ta), titanium (Ti), tungsten (W), and the like may be used for the gate metal film. The gate metal film may be a mono-layer, double-layer or multi-layer structure. In a particular implementation, the gate metal film is molybdenum (Mo) or a Ti/Al/Ti triple-layer structure with a thickness of 200 nm to 250 nm.

Figure 5:
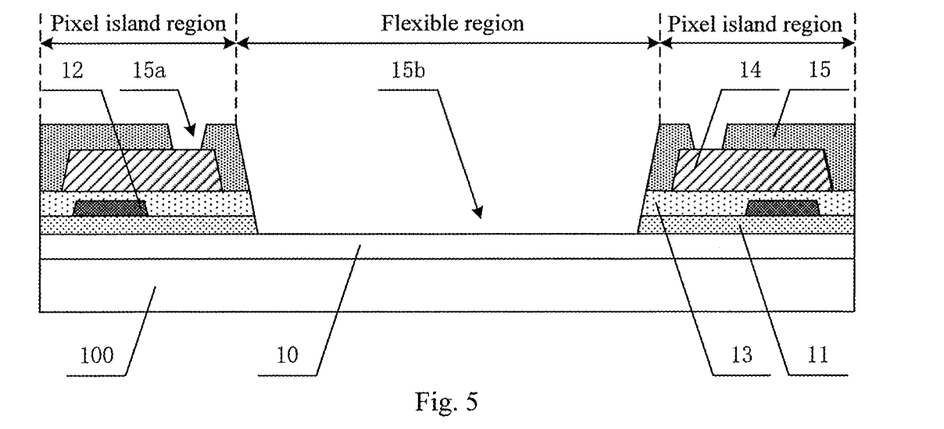
FIG. 5 is a schematic diagram of one embodiment of the present disclosure after forming an interlayer insulating layer pattern.

3. Forming an interlayer insulating layer pattern on the flexible substrate 10. Forming an interlayer insulating layer pattern comprises: depositing an interlayer insulating film on the flexible substrate 10 with the aforementioned patterns formed thereon, exposing and developing the photoresist with a monotone masking plate to form fully exposed regions at positions of the flexible region 30 and the gate electrode 14 where the photoresist is removed to expose the interlayer insulating film, and to form non-exposed regions at other positions to remain the photoresist, etching the fully exposed regions and stripping off the remaining photoresist, to form a pattern of interlayer insulating layer 15, as shown in FIG. 5. In etching, the interlayer insulating film at the position of the gate electrode 14 in the pixel island region is etched off to expose a first via hole 15a of the gate electrode 14, and the interlayer insulating film, the gate insulating layer 13 and the buffer layer 11 in the flexible region are etched off to form a flexible channel 15b exposing the flexible substrate 10. After this process, there is no structural layer on the flexible substrate 10 in the flexible region. Here, a material of $SiO_x$, $SiN_x$ or $Si(ON)_x$ may be used for the interlayer insulating layer 15. The interlayer insulating layer may be a mono-layer, double-layer or multi-layer structure, such as a $SiN_x/SiO_x$ composite film, with a thickness of 150 nm to 200 nm.

After the above processes, a plurality of pixel island regions separated from each other are formed on the flexible substrate 10, the gate electrode in each pixel column in the pixel island regions is normally routed, but there is no signal wire connected between adjacent pixel island regions. Because the interlayer insulating layer, the gate insulating layer and the buffer layer in the flexible region between adjacent pixel island regions are etched off, such that these structural layers are not involved in the stretching or bending of the flexible array substrate, not only the breakage of $SiO_x$ or $SiN_x$ material is avoided, but also the thickness of the structural layers is reduced, facilitating stretching or bending.

Figure 6:
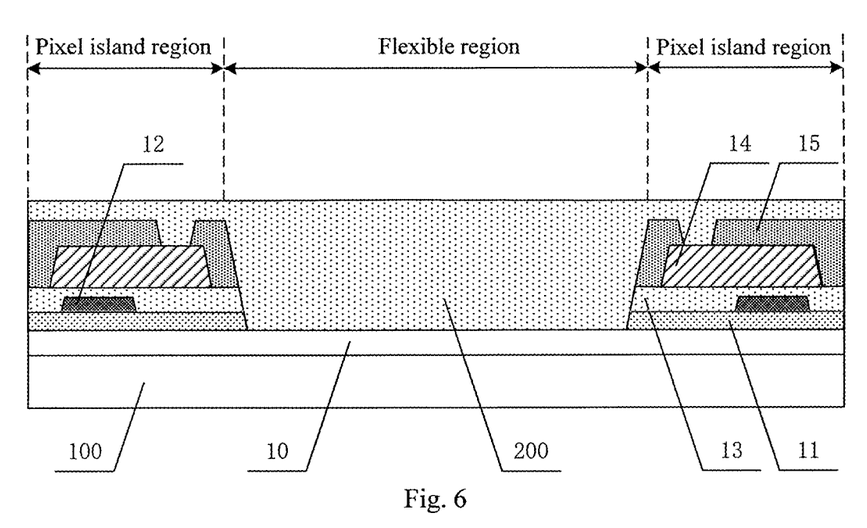
FIG. 6 is a schematic diagram of one embodiment of the present disclosure after exposure and development in forming a first elastic layer pattern.

4. Forming a first elastic layer on the flexible substrate 10. Forming a first elastic layer comprises: applying a first elastic material film 200 on the flexible substrate 10 with the aforementioned patterns formed thereon, as shown in FIG. 6. A material for the first elastic material film 200 may be a positive photoresist of polyimide. The first elastic material film 200 is exposed and developed, and the first elastic material film 200 outside the flexible region is removed, to form a first elastic layer 18 on the flexible substrate 10 within the flexible region, as shown in FIG. 7.

Figure 7:
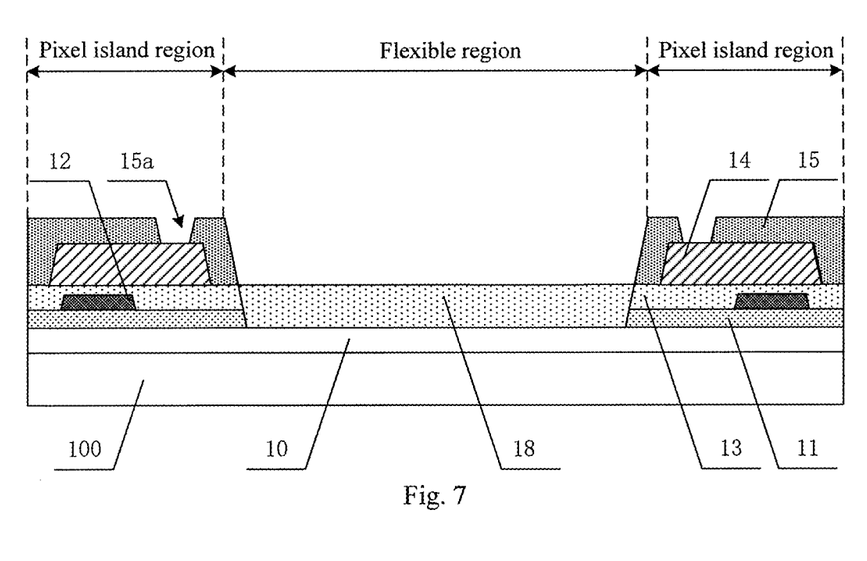
FIG. 7 is a schematic diagram of one embodiment of the present disclosure after forming the first elastic layer pattern by an etching process.

The elastic material film 200 in the fully exposed regions may be etched off by an etching process to expose the interlayer insulating layer 15 and the first via hole 15a, as shown in FIG. 7.

For example, but not limited thereto, a PI material or a planarization (PLN) material may be used for the elastic layer 18, and the thickness of the elastic layer is 1.5 μm to 2.5 μm. If a planarization (PLN) material (i.e., a material for forming a planarization layer) is used to form the first elastic layer, the stress of the film layer can be further reduced.

Figure 8:
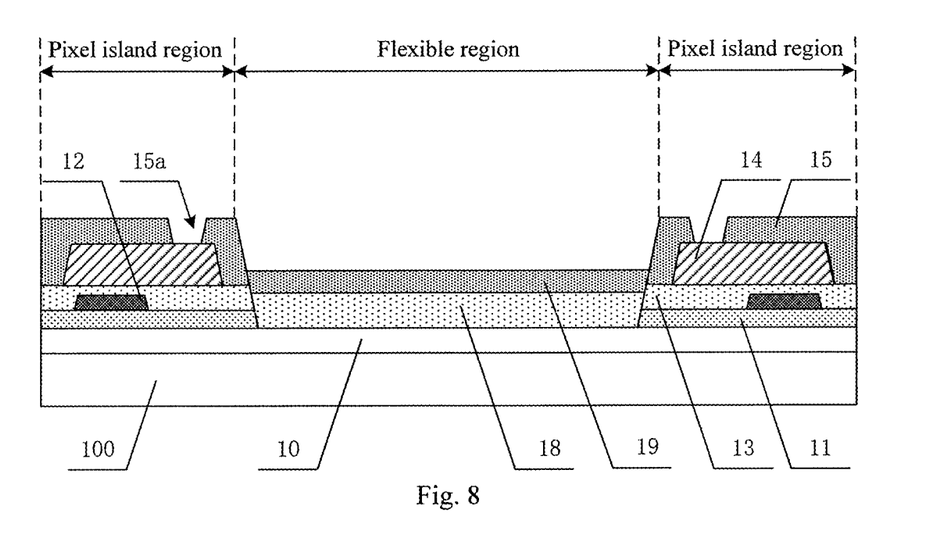
FIG. 8 is a schematic diagram of one embodiment of the present disclosure after forming a first connecting wire.

5. Forming a first connecting wire 19 on the first elastic layer 18. Forming a first connecting wire 19 comprises: depositing a metal layer on the first elastic layer 18, and performing a patterning process, to form a first connecting wire, as shown in FIG. 8. The first connecting wire may have an S shape, a U shape or a sine curve shape so that the first connecting wire can have good stretchability and bendability. A material for forming the first connecting wire may also be a conductive polymer.

The first connecting wire may or may not be connected to the gate electrodes of adjacent pixel island regions.

A material with high stretching resistance, such as nano-silver, single walled carbon nanotube (SWNT), graphene or an organic conductive polymer such as PEDOT:PSS (poly (3,4-ethylenedioxythiophene)-poly(styrenesulfonate)) may be used to form the first connecting wire. The first connecting wire 19 formed may have a width of 5 μm to 10 μm and a thickness of 0.8 nm to 1.2 nm.

In order to further ensure the reliability for forming the first connecting wire 19, the conductive polymer used may have an affinity to the first elastic layer 18.

Figure 9:
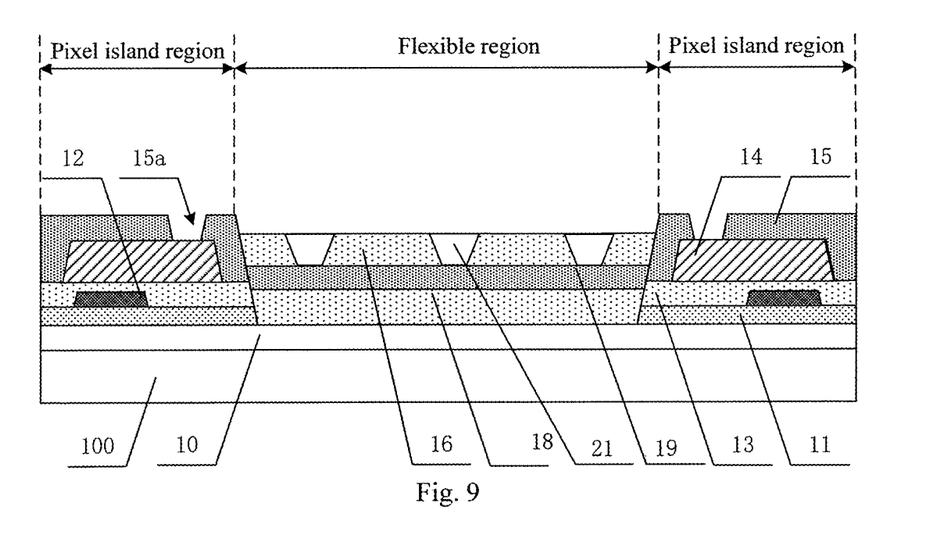
FIG. 9 is a schematic diagram of one embodiment of the present disclosure after forming a second elastic layer.
Figure 10:
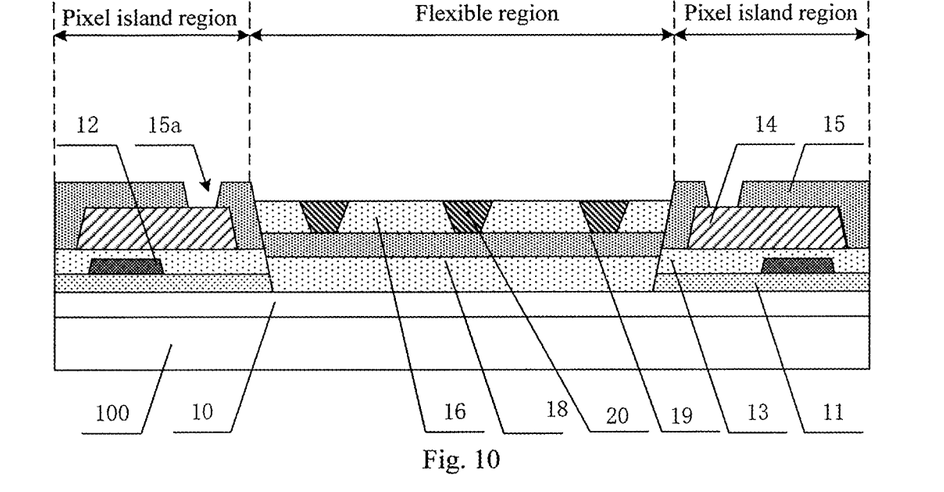
FIG. 10 is a schematic diagram of one embodiment of the present disclosure after forming an elastic conductive pillar.

After forming the first connecting wire 19, a second elastic layer 16 and a second connecting wire 17 are further formed sequentially, as shown in FIG. 9 to FIG. 11. For the forming processes for the second elastic layer 16 and the second connecting wire 17 and the materials used, reference can be made to the above description regarding the first elastic layer 18 and the first connecting wire 19. Here, it should be noted that when forming the second elastic layer 16, an interlayer via hole 21 is simultaneously formed in the second elastic layer 16 by exposing and developing, and an elastic conductive pillar 20 is formed in the interlayer via hole 21. A material for forming the elastic conductive pillar 20 comprises a conductive polymer such as PEDOT:PSS, nano-silver, carbon nanotube, graphene, and so on.

In subsequent patterning process, structural film layers such as a passivating layer, source/drain electrodes, a planarization layer and an organic light emitting layer are sequentially formed on the substrate with the aforementioned patterns formed thereon to finally form the flexible array substrate of the embodiment. The mature processes may be used for preparing the passivating layer, the source/ drain electrodes, the planarization layer, and the organic light emitting layer, and will not be reiterated here.

The flexible array substrate prepared in the present disclosure comprises a plurality of pixel island regions 40 sequentially arranged with a flexible region 30 being disposed between adjacent pixel island regions 40, wherein:

the pixel island region 40 comprises: a buffer layer 11 disposed on a flexible substrate 10; an active layer 12 disposed on the buffer layer 11; a gate insulating layer 13 covering the active layer 12; a gate electrode 14 disposed on the gate insulating layer 13; and an interlayer insulating layer 15 covering the gate electrode 14 and having a first via hole 15a;

the flexible region 30 comprises: a first elastic layer 18 on the flexible substrate 10, a first connecting wire 19 having an S shape formed on the first elastic layer, a second elastic layer 16 formed on the first connecting wire 19, an interlayer via hole 21 in the second elastic layer 16, an elastic conductive pillar 20 formed in the interlayer via hole 21, and a second connecting wire 17 having an S shape formed on the second elastic layer 16, the second connecting wire 17 being connected to the gate electrodes 14 of adjacent pixel island regions 40 respectively, through the first via holes 15a.

In practical implementation, all pixel units of several pixel columns may be configured as one pixel island region, or all pixel units of several pixel columns may be divided into a plurality of pixel island regions, each of the pixel island regions comprising pixel units within N pixel rows and M pixel columns, where M and N are an integer greater than 1.

In the present disclosure, a conductive polymer with high stretching resistance and bending resistance is used to prepare the first and second conductive wires. Because the preparation is achieved with a patterning process, the patterning of the conductive polymer can be achieved with existing process equipment without adding an ink jet printing device, which saves equipment cost, has a low production cost, ensures process quality, and has good practicability. Of course, respective first and second connecting wires may also be formed by depositing a metal layer and performing a patterning process.

Figure 12:
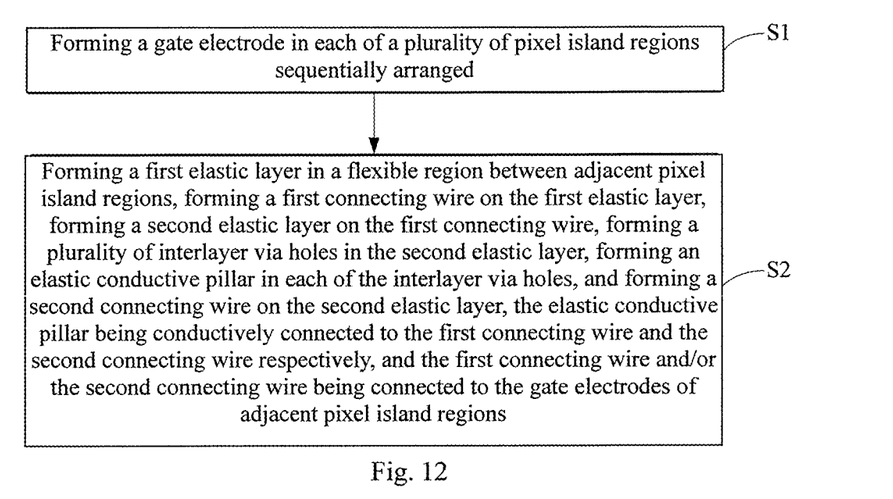
FIG. 12 is a flow chart of a preparation method of a flexible array substrate according to an embodiment of the present disclosure.

As shown in FIG. 12, the present disclosure also provides a preparation method for a flexible array substrate, comprising:

S1: forming a gate electrode in each of a plurality of pixel island regions sequentially arranged; and S2: forming a first elastic layer in a flexible region between adjacent pixel island regions, forming a first connecting wire on the first elastic layer, forming a second elastic layer on the first connecting wire, forming a plurality of interlayer via holes on the second elastic layer, forming an elastic conductive pillar in each of the interlayer via holes, and forming a second connecting wire on the second elastic layer, the elastic conductive pillar being conductively connected to the first connecting wire and the second connecting wire respectively, and the first connecting wire and/or the second connecting wire being connected to the gate electrodes of adjacent pixel island regions.

Further, S1 particularly comprises the following steps.

S11: forming an active layer, a gate insulating layer and a gate electrode sequentially on the flexible substrate; and S12: forming an interlayer insulating layer by a patterning process, wherein the interlayer insulating layer in each of the pixel island regions is provided with a first via hole, and the flexible region between adjacent pixel island regions is provided with a flexible channel such that the flexible substrate is exposed through the flexible channel.

Further, S2 particularly comprises the following steps.

S21: applying a first polyimide photoresist, the first polyimide photoresist covering the interlayer insulating layer and the flexible substrate exposed through the flexible channel; exposing and developing the first polyimide photoresist to form a fully exposed region in the flexible region; and removing the first polyimide photoresist in the pixel island regions to form a first elastic layer on the flexible substrate.

S22: forming a first conductive layer on the first elastic layer and patterning the first conductive layer to form the first connecting wire.

S23: applying a second polyimide photoresist on the first connecting wire, the second polyimide photoresist covering the interlayer insulating layer and the first elastic layer; exposing and developing the second polyimide photoresist to form a fully exposed region in an area of the flexible region other than interlayer via hole regions; and removing the second polyimide photoresist in the pixel island regions and in the interlayer via hole regions to form the second elastic layer.

S24: forming an elastic conductive pillar in each of the interlayer via holes.

A material for forming the elastic conductive pillar comprises a conductive polymer.

S25: forming a second conductive layer on the second elastic layer and patterning the second conductive layer to form the second connecting wire.

The first connecting wire and/or the second connecting wire are/is connected to the gate electrodes of adjacent pixel island regions through the first via holes.

On a projection plane parallel to the flexible array substrate, the first connecting wire and the second connecting wire have an S-shape, a U shape or a sine curve shape, and the connecting wires have a width of 5 µm to 10 µm and a thickness of 0.8 nm to 1.2 nm.

Figure 13:
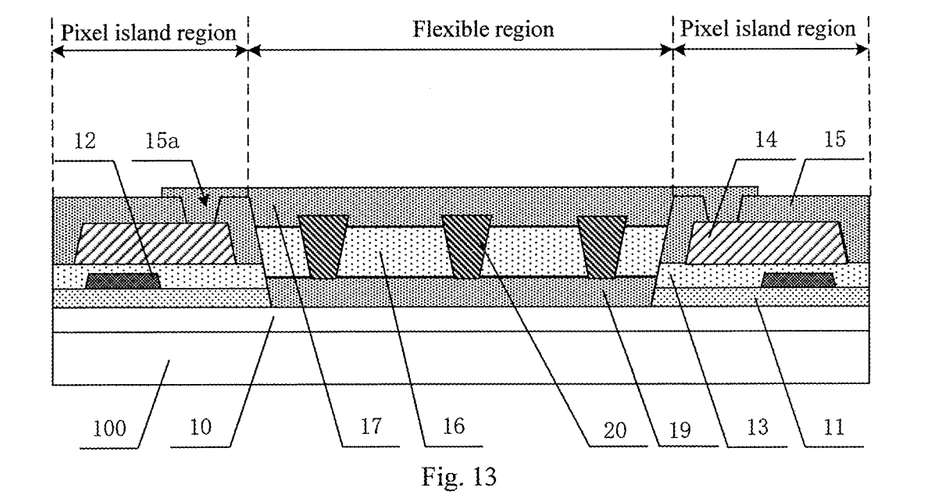
FIG. 13 is a structural schematic diagram of a flexible array substrate according another embodiment of the present disclosure.

It should be noted what described above with reference to FIGS. 3-12 is the case where the flexible region comprises the first and second elastic layers and the first and second connecting wires. As an alternative, the first elastic layer may be omitted and the second elastic layer may be thickened. FIG. 13 shows a structural schematic diagram of a flexible array substrate with the first elastic layer being omitted. When preparing the flexible array substrate as shown in FIG. 13, the step of forming a first elastic layer on the flexible substrate as shown in FIGS. 6 and 7 may be omitted, and the first connecting wire may be directly formed in the flexible region.

The present disclosure also provides a flexible display panel comprising the flexible array substrate of the aforementioned embodiments. The flexible display panel may be any product or component having a displaying function such as mobile phone, tablet computer, television, display, notebook, digital photo frame, navigator and the like.

The above descriptions are only preferred embodiments of the present disclosure and explanations of the technologies and principles used. It should be understood by those skilled in the art that the scope of the invention involved in the present disclosure is not limited to technical solutions obtained from particular combinations of the above technical features, but also encompasses other technical solutions obtained from any combination of the above technical features or equivalents thereof without departing from the inventive concept. For example, the technical solutions can be obtained by replacing the above technical features with technical features having similar functions as disclosed in the present disclosure (but not limited thereto).

What is claimed is:

1. A flexible array substrate, comprising a plurality of pixel island regions sequentially arranged, with a flexible region being disposed between adjacent pixel island regions, wherein
   each of the pixel island regions comprises a gate electrode, and the flexible region comprises a first connecting wire and a second connecting wire disposed respectively in different layers, and an elastic layer disposed between the first connecting wire and the second connecting wire, wherein a plurality of interlayer via holes are disposed in the elastic layer, an elastic conductive pillar is disposed in each of the interlayer via holes and is conductively connected to the first connecting wire and the second connecting wire respectively, and the second connecting wire is directly connected to the gate electrodes of adjacent pixel island regions, through via holes in an interlayer insulating film in the pixel island regions,
   wherein a material for forming the elastic conductive pillar comprises a conductive polymer,
   wherein a material for forming the elastic layer comprises polyimide, and
   wherein the term "elastic" means an excellent stretching property is also exhibited in a direction perpendicular to the flexible array substrate, so as to have sufficient stretching and bending properties in both the horizontal and vertical directions.

2. The flexible array substrate according to claim 1, wherein the flexible region further comprises an additional elastic layer disposed below the first connecting wire.

3. The flexible array substrate according to claim 2, wherein a material for forming the additional elastic layer comprises polyimide or a planarization material.

4. The flexible array substrate according to claim 1, wherein a material for forming the at least one of the first connecting wire and the second connecting wire comprises a conductive polymer or a metal.

5. The flexible array substrate according to claim 1, wherein the at least one of the first connecting wire and the second connecting wire has an orthographic projection with an S-shape, a U shape or a sine curve shape on a substrate of the flexible array substrate.

6. The flexible array substrate according to claim 1, wherein the flexible array substrate further comprises a flexible substrate, wherein the pixel island regions and the flexible region are disposed on the flexible substrate.

7. The flexible array substrate according to claim 6, wherein a material for forming the flexible substrate comprises polyimide.

8. A flexible display panel comprising the flexible array substrate according to claim 1.

9. A preparation method for a flexible array substrate comprising:
   forming a gate electrode in each of a plurality of pixel island regions sequentially arranged; and
   forming a first connecting wire in a flexible region between adjacent pixel island regions, forming an elastic layer on the first connecting wire, forming a plurality of interlayer via holes in the elastic layer, forming an elastic conductive pillar in each of the interlayer via holes, and forming a second connecting wire on the elastic layer, wherein the elastic conductive pillar is conductively connected to the first connecting wire and the second connecting wire respectively, and the second connecting wire is directly connected to the gate electrodes of adjacent pixel island regions, through via holes in an interlayer insulating film in the pixel island regions,
   wherein a material for forming the elastic conductive pillar comprises a conductive polymer,
   wherein a material for forming the elastic layer comprises polyimide, and
   wherein the term "elastic" means an excellent stretching property is also exhibited in a direction perpendicular to the flexible array substrate, so as to have sufficient stretching and bending properties in both the horizontal and vertical directions.

10. The preparation method according to claim 9, further comprising a step of forming an additional elastic layer in the flexible region between adjacent pixel island regions, before forming the first connecting wire.

11. The preparation method according to claim 10, wherein the step of forming the gate electrode in each of a plurality of pixel island regions sequentially arranged comprises:
    forming an active layer, a gate insulating layer and the gate electrode sequentially on a flexible substrate; and
    forming the interlayer insulating layer by a patterning process, wherein the interlayer insulating layer in each of the pixel island regions is provided with a first via hole of the plurality of interlayer via holes, and the flexible region between adjacent pixel island regions is provided with a flexible channel such that the flexible substrate is exposed through the flexible channel.

12. The preparation method according to claim 11, wherein the step of forming an additional elastic layer in the flexible region between adjacent pixel island regions comprises:
    applying a first polyimide photoresist, the first polyimide photoresist covering the interlayer insulating layer and the flexible substrate exposed through the flexible channel; exposing and developing the first polyimide photoresist to form a fully exposed region in the flexible region; and removing the first polyimide photoresist in the pixel island regions, thereby forming an additional elastic layer on the flexible substrate.

13. The preparation method according to claim 12, wherein the steps of forming the first connecting wire, forming the elastic layer on the first connecting wire, forming the plurality of interlayer via holes in the elastic layer, forming the elastic conductive pillar in each of the interlayer via holes, and forming the second connecting wire on the elastic layer comprise:
    forming a first conductive layer on the additional elastic layer and patterning the first conductive layer to form the first connecting wire;
    applying a second polyimide photoresist on the first connecting wire, the second polyimide photoresist covering the interlayer insulating layer and the additional elastic layer; exposing and developing the second polyimide photoresist to form a fully exposed region in an area of the flexible region other than regions of the interlayer via holes; and removing the second polyimide photoresist in the pixel island regions and in the regions of the interlayer via holes to form the elastic layer;
    forming the elastic conductive pillar in each of the interlayer via holes; and
    forming a second conductive layer on the elastic layer and patterning the second conductive layer to form the second connecting wire.

14. The preparation method according to claim 9, wherein at least one of the first connecting wire and the second connecting wire has an orthographic projection with an S-shape, a U shape or a sine curve shape on a substrate of the flexible array substrate.

15. The preparation method according to claim 14, wherein a material for forming the at least one of the first connecting wire and the second connecting wire comprises a conductive polymer or a metal.

* * * * *